United States Patent [19]

Stammely

[11] Patent Number: 4,527,216
[45] Date of Patent: Jul. 2, 1985

[54] SUB-MILLIAMP MECHANICAL RELAY CONTROL

[75] Inventor: Thomas E. Stammely, Cary, N.C.

[73] Assignee: International Business Machines Corporation, Armonk, N.Y.

[21] Appl. No.: 475,780

[22] Filed: Mar. 16, 1983

[51] Int. Cl.[3] .............................................. H01H 47/32
[52] U.S. Cl. ...................................... 361/156; 361/208
[58] Field of Search ......................... 361/156, 208, 191

[56] References Cited

U.S. PATENT DOCUMENTS 4,257,081 3/1981 Sauer et al. ........................... 361/156
4,418,374 11/1983 Callan ............................... 361/191 X

FOREIGN PATENT DOCUMENTS 2009549 6/1979 United Kingdom ................. 361/156

Primary Examiner—Reinhard J. Eisenzopf
Attorney, Agent, or Firm—Joscelyn G. Cockburn

[57] ABSTRACT

A relay driver circuit, suitable for controlling a bistable relay, includes a storage device which is charged to a first voltage level by a low current flow voltage source. A first switching circuit couples the storage device to the bistable relay when the first voltage level exceeds a predetermined value. The charge on the storage device is dumped into the relay and forces it into a first state (set). A second switching circuit is coupled to sense the voltage on the storage device and the voltage on the low voltage source. When the voltage on the low voltage source falls below the voltage on the storage device, current flows from the storage device and forces the relay into a second state (reset). The reset time is within 100 μs.

23 Claims, 3 Drawing Figures 4,527,216

SUB-MILLIAMP MECHANICAL RELAY CONTROL

BACKGROUND OF THE INVENTION

1. Field of the Invention

The invention relates to electrical circuit arrangements in general and more particularly to circuits which control the coils of a relay.

2. Prior Art

The use of electrical circuits to generate current for controlling the coils of a relay is well known in the prior art. Relays may be broadly divided into two classes. The first class of relays utilizes current which generates a magnetic field to move a mechanical set of contacts. The contacts may be supported on an open frame arrangement or in a glass enclosed capsule called a reed. The coil surrounds the reed and magnetic force causes the movement of the contacts. Current must flow through the coil continuously in order to maintain the contact.

The second class of relays is the so-called bistable or magnetic latching relay. These relays utilize a holding magnet to hold the contacts in one state or the other, after the contacts have been transferred by passing current through the "set" or "reset" coil. When an electrical current is passed through the "set" coil, the magnet holds the contact in the set state or set position. When an electrical current is passed through the "reset" coil, a force which is greater than that of the holding magnet forces the contacts into the reset state. The set and reset coils are usually wound in opposite directions. Because these relays are bistable, the coils do not require continuous current flow.

Because the invention, to be described below, is primarily concerned with the bistable relays, only prior art which relates to the bistable type relays will be described hereinafter.

U.S. Pat. No. 4,257,081 is an example of the prior art circuit arrangement suitable for controlling a bistable relay. A capacitor is connected in series with the relay. The relay and capacitor are connected across an excitation voltage. A transistor switch is connected in parallel with the relay and the capacitor. When the excitation voltage is activated, current flows through the relay and the capacitor. The current forces the relay into the set state and charges the capacitor. When the excitation voltage is deactivated, the switch discharges the capacitor and resets the relay.

Although the device of the prior art patent works well for its intended purpose, it requires a relatively high current flow and therefore cannot be used in an environment where a high current flow is lacking. Also, there is a possibility that once the relay is set if a malfunction occurs in the circuit, it remains in the set condition. In other words, the relay is not fail-safe. Needless to say, the lack of the fail-safe feature renders the prior art circuit unacceptable for several applications.

SUMMARY OF THE INVENTION

It is therefore the object of the present invention to provide a more efficient relay driver circuit than was heretofore possible.

It is another object of the present invention to provide a fail-safe relay driver circuit.

It is yet another object of the present invention to provide a relay driver circuit which may use a relatively low current/low voltage source for supplying energization current to a relay.

The improved relay driver circuit includes at least one capacitor which is charged to a referenced voltage level. A first switching device is coupled to sense the voltage on the capacitor and to partially discharge the capacitor into the set coil of the relay when the voltage on the capacitor exceeds the referenced voltage. A second switching device is coupled to sense an input drive voltage and the voltage on the capacitor. When the input drive voltage falls below the voltage of the partially discharged capacitor, the second switching device discharges the partially discharged capacitor to reset the coils of the relay.

The foregoing and other features and advantages of the invention will be more fully described in the accompanying drawings.

DETAILED DESCRIPTION OF THE PREFERRED EMBODIMENT

Although the present invention, to be described hereinafter, is intended to be used in any environment wherein a circuit is needed to activate a relay, it works well in a telecommunication system and as such will be described in this environment. However, this should not be construed as a limitation on the scope of the present invention since it is within the skill of the art to make minor changes, if any, to the described invention and extend said invention to other fields.

Figure 1:
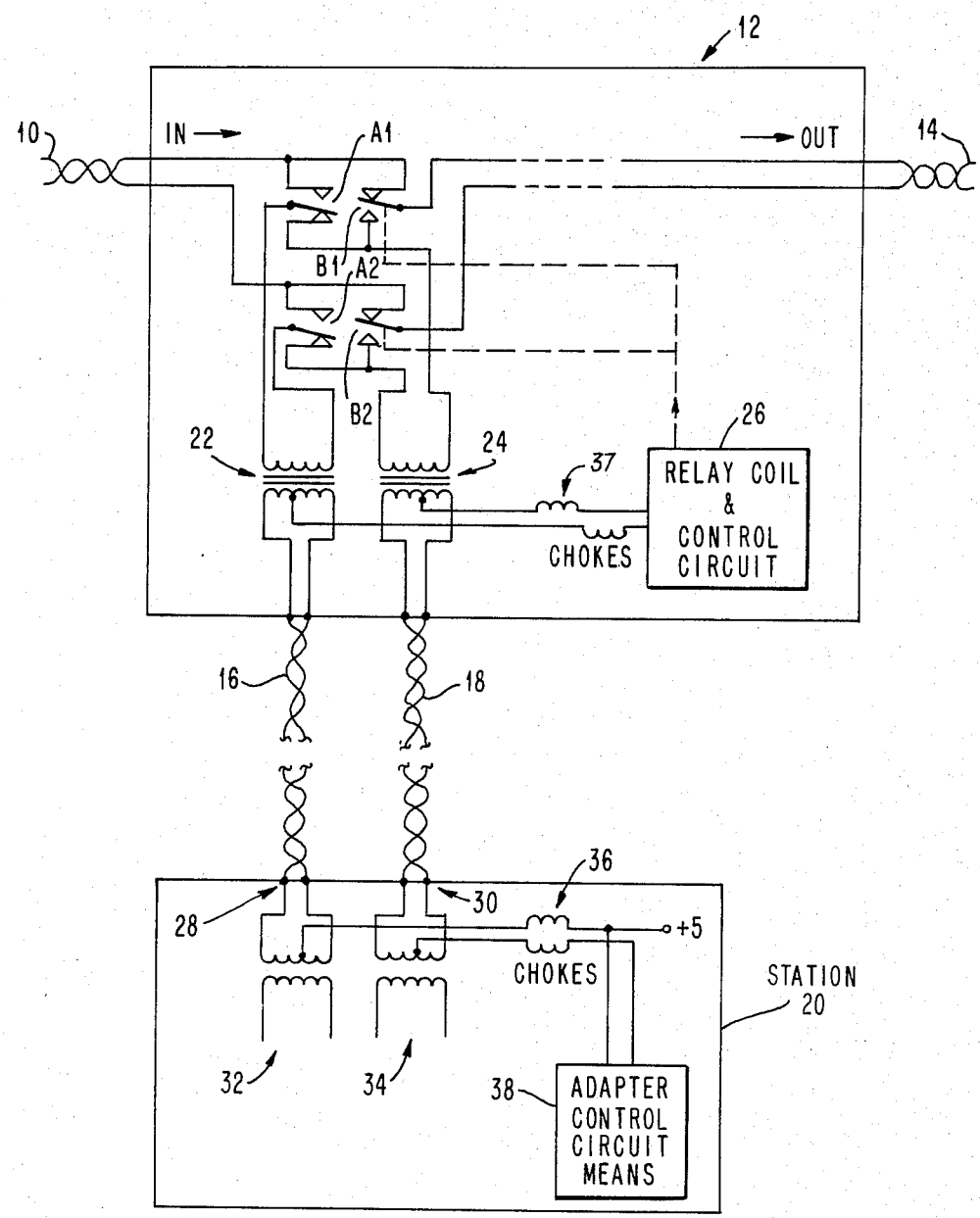
FIG. 1 shows a schematic diagram of a telecommunication network in which the relay driver circuit, according to the present invention, is incorporated.

FIG. 1 shows a telecommunication system in which the present invention finds use. The telecommunication system is comprised of a communication link identified by numeral 10. The communication link transmits data from a remote location into the wire concentrator identified by numeral 12. Data from wire concentrator (WC) 12 is transmitted over conductor 14 to a remote location. The wire concentrator 12 is connected over conductors 16 and 18 respectively, to a station 20. In the preferred embodiment of this invention conductors 16 and 18 are twisted wire pairs. The function of wire concentrator 12 is to switch station 20 into the network so that data which is transmitted on conductor 10 is conveyed to the station and data which is to be transmitted from station 20 is transmitted out on conductor 14. To this end wire concentrator 12 includes switching relays, whose contacts are identified by A1, A2, B1 and B2, and a pair of transformers 22 and 24. The transformers are interconnected to said contacts. The relay coil and control circuit which drive the coil are embedded in the circuit means identified by numeral 26. Circuit means 26 is connected through a pair of choke coils to transformers 22 and 24 respectively.

Station 20 includes a business machine (not shown) which is to be coupled at terminals 28 and 30 respectively to conductors 16 and 18. The business machine (not shown) is interconnected by transformers 32, 34, choke coil 36 and adapter control circuit 38 to terminals 28 and 30 respectively.

Usually the wire concentrator 12 has no electrical power of its own. Therefore, the electrical power for activating the relay is supplied from adapter control circuit 38. Usually a DC relay current of approximately 150 milliamperes is required to pick these relays. The telecommunication configuration of FIG. 1 poses several problems. For example, the adapter control circuit cards which drive the relay are usually populated with LSI (Large Scale Integrated) circuitry which cannot directly drive the relays because LSI circuitries are generally low voltage, low current devices. If one wants to use LSI circuitries to drive the relays, high current discrete transistors and current limiting resistors must be provided on these cards. Also, the distance between the adapter control circuit and the wire concentrator must be relatively short in order to minimize the voltage drops in the interconnecting transmission wires 16 and 18, respectively. Because a relay usually requires a relatively large amount of current, in order for this configuration to work, the adapter control circuit 38 of the using machine (not shown) must supply a relatively large amount of current through the adapter card to power the relays. This dictates that the host machine must be designed with a significant amount of power for driving the relay at a remote distance.

Figure 2:
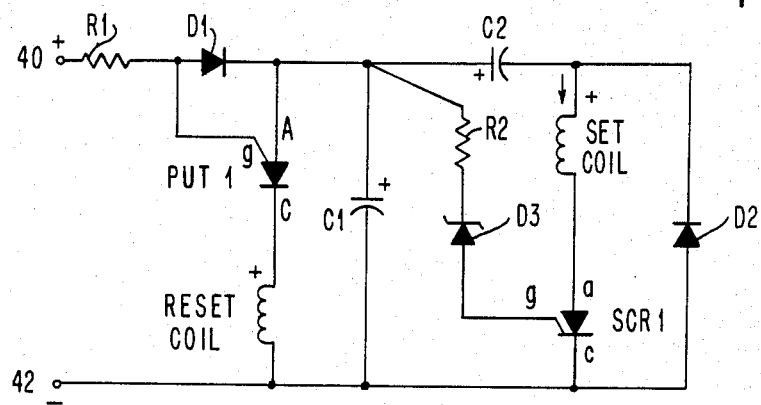
FIG. 2 shows one embodiment of the relay driver circuit according to the teaching of the present invention.

FIG. 2 shows one embodiment of the present invention which eliminates the above recited limitations of the arrangement of FIG. 1. The circuit in FIG. 2 is implemented in relay coil and control circuit means 26 (FIG. 1). Terminals 40 and 42 of the circuit are connected to the choke coil 37 (FIG. 1). Terminal 42 represents the ground potential (that is negative terminal) of the circuit, while terminal 40 represents the positive terminal. The excitation coil of the relay includes a reset coil and a set coil (FIG. 2). One end of the reset coil is connected to negative terminal 42 and the positive end of the reset coil is connected to cathode (C) of a programmable unijunction transistor (PUT-1). As will be explained hereinafter, the function of PUT-1 is to sense the incoming signal from the adapter control circuit 38 (FIG. 1) and to discharge capacitor C1 through the reset coil when said signal falls below the signal on capacitor C1.

Still referring to FIG. 2, the gate electrode of PUT-1 is coupled through resistor R1 to positive terminal 40. Likewise, diode D1 interconnects the gate electrode and the anode electrode of PUT-1. A capacitor C1 is coupled across terminals 40 and 42 respectively. The size of capacitor C1 is such that the charge stored thereon is sufficient to activate the set coil and reset coil of the relay consecutively. Capacitor C2 connects the positive plate of capacitor C1 to the positive terminal of the set coil and the negative terminal of the set coil is coupled to the anode electrode of silicon control rectifier (SCR1). The cathode (C) of SCR1 is connected to negative terminal 42 while the gate electrode of SCR1 is connected through zener diode D3 and resistor R2 to the positive plates of capacitors C1 and C2 respectively. As will be explained hereinafter, the function of SCR1 is to discharge a portion of the charge in C1 through the set coil of the latching relay when the voltage in C1 exceeds that of the reference voltage of D3. A diode D2 is connected across negative terminal 42 and positive terminal 40.

In operation, when a voltage, say greater than 5 volts, is applied between terminals 40 and 42 respectively, a relatively low volume current, say within the submilliamp range, flows through R1 and D1 and charges C1. Ideally, no current will flow through the other path of the circuit until the charge and voltage accumulated in C1 equals the voltage of D3. When this occurs, the zener diode conducts and current flows into the gate of SCR1. SCR1 in turn conducts and discharges C1 through C2 into the set coil of the relay. With current flowing through the set coil, the relay contacts (FIG. 1) move into the closed position. The current flow from C1 to C2 decreases exponentially to zero. With C2 charge the current drain of C1 is halted. As long as the applied voltage between 40 and 42 is present, C1 remains charged and the only current through R1 and D1 is a small trickle current through R2 and D3 and the gate of SCR1.

Should the input voltage fall either intentionally or via a wire break, current stops flowing through D1. PUT-1 or some other equivalent sensing means sees its gate lead now at a lower potential than its anode lead. (The anode voltage of the PUT is at the voltage potential of C1.) It is worthwhile noting that a PUT is a very high impedance device when the gate electrode voltage is less than the anode electrode voltage. However, when the conditions are reversed, that is, the anode voltage is higher than the gate voltage, the PUT becomes a low resistance device. Both C1 and C2 discharge through PUT-1 via the path through D2. The current which flows through the PUT enters the reset coil of the latching relay to place the relay in the second or reset condition.

Figure 3:
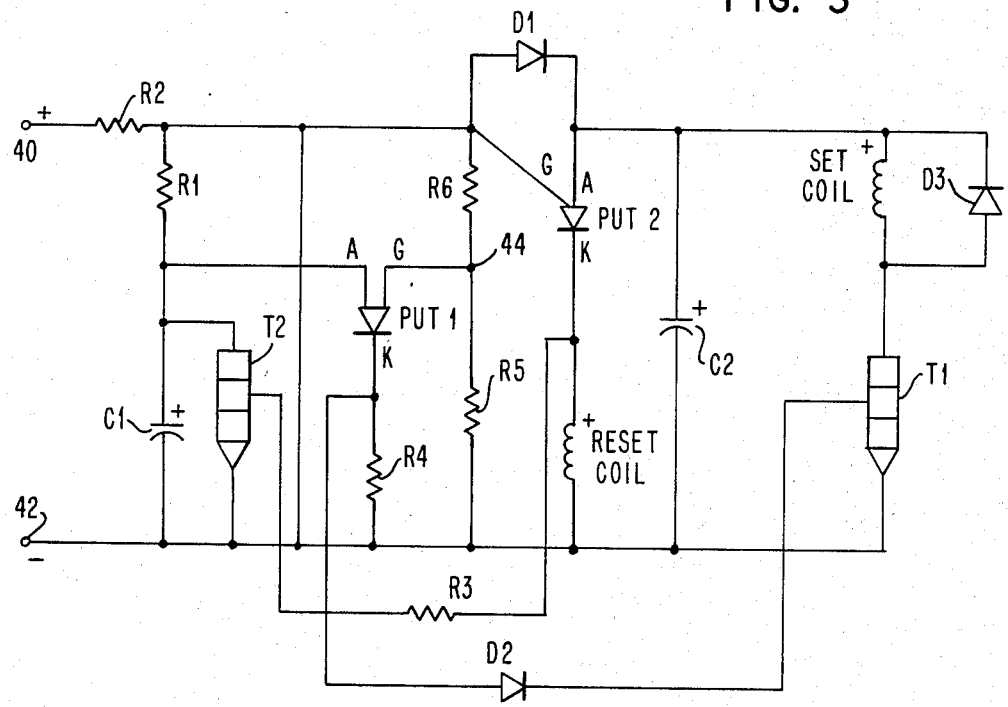
FIG. 3 shows an alternative embodiment of the driver circuit.

FIG. 3 shows an alternative embodiment of the present invention. In this embodiment the enabling voltage which is applied to terminals 40 and 42 respectively may be less than five volts, say 3.5 volts. In order to simplify this discussion, elements which are common in FIGS. 2 and 3 are identified by the same numeral. As with FIG. 2, terminals 40 and 42 (FIG. 3) are connected to the choke coil 37 of FIG. 1. Terminal 42 represents the negative terminal of the circuit while terminal 40 represents the positive terminal. The function of the circuit in FIG. 3 is to accept a relatively low voltage, low current signal at terminals 40 and 42, respectively and to generate an adequate current which when passed through the set coil forces the contact of the relay (FIG. 1) into a first state, say the set state. In the event that the signal at terminals 40 and 42 is discontinued, the circuit provides a current through the reset coil to force the contact of the latching relay (FIG. 1) into the second state, say the reset state.

To this end, a PUT-1 is coupled through diode D2 to the base emitter of a switching means T1. In the preferred embodiment of this invention, switching means T1 is a transistor. The negative terminal of the set coil is connected to the base of transistor T1 while the emitter of transistor T1 is connected to the negative terminal 42. Resistor R4 interconnects the cathode of PUT-1 to negative terminal 42. The positive terminal of the set coil is connected to positive terminal 40. A diode D3 is placed in parallel with the set coil and interconnects the negative terminal of the set coil to the positive terminal 40 of the circuit. The gate electrode of PUT-1 is connected to a node identified by numeral 44. Node 44 interconnects resistors R5 and R6 respectively. Resistors R5 and R6 are a voltage divider network and provide a reference voltage level at node 44. The resistors are connected across positive terminals 40 and 42, respectively. As will be explained subsequently, when the voltage on capacitor C1 is greater than the reference voltage generated at node 44, the PUT conducts and turns T1 on. This forces C2 to discharge current through the set coil.

Still referring to FIG. 3, the anode electrode of PUT-1 is coupled through R1 and R2 to positive terminal 40. A storage capacitor C1 interconnects the anode electrode of PUT-1 to negative terminal 42. The positive plate of capacitor C1 is connected through transistor T2 to negative terminal 42 and the positive terminal of the reset coil. In order to place the latching relay in its second (that is the reset state) the positive terminal of the reset coil is connected to a switching means identified as PUT-2. The negative terminal of the reset coil is connected to negative terminal 42. PUT-2 is comprised of a cathode electrode which is connected to the positive terminal of the reset coil, a gate electrode which is connected to positive terminal 40 and an anode electrode which is connected to the positive plate of capacitor C2. A diode D1 interconnects the gate electrode of PUT-2 to its anode electrode. The negative plate of C2 is connected to the negative terminal 42. As will be described hereinafter, C2 formed a storage means which stores sufficient current to energize both the set coil and the reset coil of the relay. Although it is within the skill of the art to select values for the various electrical components of FIG. 3, Table I gives a set of values which works satisfactorily. However, these values should not be construed as a limitation on the scope of the present invention since it is fully recognized that one of ordinary skill can change these values without departing from the scope of the present invention.

TABLE I

| Schematic Reference | Description |
| --- | --- |
| R1 | 24.9K 1% ⅛ watt Resistor |
| R2 | 511 1% ⅛ watt Resistor |
| R3 | 1K 1% ⅛ watt Resistor |
| R4 | 3.32K 1% ⅛ watt Resistor |
| R5 | 698K 1% ⅛ watt Resistor |
| R6 | 432K 1% ⅛ watt Resistor |
| C1 | 33 Microfarad 10 v. Tantalum Capacitor |
| C2 | 1k Microfarad 10 v. Tantalum Capacitor |
| C3 | 8 Microfarad 10 v. Tantalum Capacitor |
| T1, T2 | 2N3252 Transistor or Equivalent. |
| PUT1, PUT2 | GE D13T2 Programmable Unijunction Transistor or Equiv. |
| D1 | 1N60 or Equiv. Germanium Diode |
| D2, D3 | 1N4150 or Equiv. Silicon Diode |

Still referring to FIG. 3, in operation a relatively low voltage, say greater than 3.6 volts, is applied to terminals 40 and 42, respectively. C1 and C2 begin to charge. Simultaneously, voltage dividers R5 and R6 establish a reference potential at node 44 which is transmitted to the gate electrode of PUT-1. When C1 charges to a value greater than the reference voltage at G, PUT-1 switches on and discharges C1 into R4. During this discharge, as long as the voltage across R4 is greater than say 2 diode drops ($V_{d2} + T1_{VBE}$) current flows into the base of T1, turning it on. T1 turning on causes C2 to discharge through the set coil. This current transfers the relay contacts into the first state (say the set state). Preferably, the value of C2 is chosen such that approximately 70% of its initial charge is left after T1 stops conducting. This ensures that enough energy is in the system to reset the relay immediately after a relay set should the source voltage drop for any reason. It ought to be noted that this is a precaution against the relay being left in an undesirable set condition after a station stops transmitting signals. Also, R1–R6 resistors are chosen to keep the PUT-1 current above its valley point or "holding current" after the initial discharge of C1. If allowed to turn off, the circuit would recycle to initiate another C1 charge and PUT-1 turn-on pulse. This is a relaxation oscillator behavior and would be undesirable. The holding current, however, is too low to produce a voltage drop across R4 greater than two diode drops.

Still referring to FIG. 3, PUT-2 forms the switching device which initiates the reset cycle of the relay. As long as the required voltage is applied to terminals 40 and 42, a microamp bias current flows in the PUT-1 circuitry and through D1. PUT-2 with its gate and anode electrodes connected across D1 sees a more positive voltage on the gate electrode than the anode. In this configuration PUT-2 is a high impedance device and does not conduct. If the source voltage on terminals 40 and 42 drops, the anode electrode of PUT-2 is left at the voltage of C2 which is the most positive in the circuit. Simultaneously, the signal on terminal G drops. When G falls below (say 0.6 volt) the voltage of the anode (A) electrode, PUT-2 conducts and discharges C2 into the reset coil. This in turn transfers the relay contact to its original or reset condition. The C2 discharge continues until the valley current is reached and PUT-2 is turned off. The circuit is now reset awaiting another application of the source voltage for another cycle. This concludes the detailed description of the present invention.

It should be noted that the PUT function is a comparator in the above-described circuit arrangement. It is within the skill of the art to replace the PUT. Therefore, it is within the skill of the art to replace the PUT by an equivalent circuitry without departing from the scope of the present invention.

Several benefits inure to one who uses the above invention. Among the benefits are the following:

The power needed to control the excitation coil of the relay is provided from LSI circuitry. No external high power circuitry is needed to drive the relay.

The drive distance from the business machine at station 20 (FIG. 1) to wire concentrator 12 is essentially unlimited. This is possible because the current which is supplied from adapter control circuit 38 is small. Therefore, the voltage losses in the drive lines represent a minor voltage drop at the relay. In fact, the peak circuitry input may contain a large resistor to control the charging time of the integrating capacitor C1 (FIG. 2) or C2 (FIG. 3).

Because the circuit utilizes the gate of a very fast turnon PUT to sense the condition (i.e. the absence or presence) of the input signal, the relay is reset within a relatively short time interval.

Finally, because the energy needed to activate the relay is derived from a small current over a period of time (integrated), the host power requirement can be decreased by orders of magnitude to the point of being negligible compared to conventional relay driver circuits.

Although the invention has been particularly shown and described with reference to a preferred embodiment thereof, it will be understood by those skilled in the art that various changes in form and details may be made therein without departing from the spirit and scope of the invention.

Having thus described my invention, what I claim as new, and desire to secure by Letters Patent is:

1. A control circuit suitable for driving the set and the reset energization coils of a bistable relay comprising:
   a first circuit means disposed in parallel with the set and reset coils; said first circuit means being operable for setting a first reference voltage level;
   at least one storage means coupled to the first circuit means and the set and reset coils, said first storage means being operable for storing a predetermined electrical charge with sufficient magnitude for setting and resetting the bistable relay;
   a first switching means coupled to the set energization coil and the storage means; said first switching means being operable for causing the storage means to discharge a portion of its charge into the set energization coil to set the relay into a first state; and
   a second switching means coupled to the storage means and the reset coil; said second switching means being operable for causing the storage means to discharge the remaining portion of its charge into the reset coil to reset the relay into a second state.

2. The control circuit of claim 1 further including an excitation means coupled in parallel with the energization coils.

3. The control circuit as recited in claim 2 wherein the excitation means is a low current/low voltage source.

4. The control circuit of claim 1 wherein the first circuit means includes a zener diode having one electrode connected to the first switching means and the other electrode coupled to the storage means.

5. The control circuit of claim 1 wherein the first circuit means includes a pair of series resistors connected to the first switching means.

6. The control circuit of claim 1 wherein the storage means includes a capacitor.

7. The control circuit of claim 6 wherein the capacitor is sized so that the charge accumulating thereon is of sufficient magnitude to set and reset the energization coils of the relay.

8. The control circuit of claim 1 wherein the first switching means includes a silicon control rectifier (SCR).

9. A control circuit suitable for driving set and reset energization coils of a bistable relay comprising:
   a first circuit means disposed in parallel with the set and reset coils; said first circuit means being operable for setting a first reference voltage level;
   at least one storage means coupled to the first circuit means and the set energization coil, said first storage means being operable for storing a predetermined electrical charge;
   a first switching means coupled to the energization coils and the storage means; said first switching means including a programmable unijunction transistor (PUT), a transistor switch and a diode interconnecting the cathode of said PUT to the base electrode of the transistor switch and being operable for periodically discharging the storage means into the energization coil to set the relay into a first state; and
   a second switching means coupled to the storage means and the reset coil; said second switching means being operable to periodically discharge the storage means into the reset coil.

10. The control circuit of claim 1 wherein the second switching means includes a PUT; said PUT having its cathode electrode connected to the reset coil, its anode electrode connected to the storage means and the gate electrode coupled to sense an excitation voltage wherein the PUT conducts and dumps current into the reset coil when the excitation voltage is less than a voltage on the storage means.

11. The control circuit of claim 1 wherein the first switching means discharges the storage means when the voltage on the storage means is greater than the first reference voltage level.

12. In a communication network system having a communication link wherein bistable relays are being utilized for inserting a plurality of network ports into the link with the relays being responsive to an enabling electrical signal generated from a device connected to said ports an improved circuit arrangement for controlling the bistable relay comprising:
   a storage means operable to receive the electrical signal;
   and to store a charge of sufficient magnitude to set and reset the bistable relay;
   a circuit means coupled in parallel with the storage means and operable to limit the charge thereon;
   a first switching means having a control electrode connected to the circuit means and an anode electrode connected to a set coil of the bistable relay; and
   a second switching means having at least three electrodes with one of the electrodes being coupled to sense the enabling electrical signal, a second electrode being coupled to the reset coil of the bistable relay and a third electrode being coupled to the storage means whereby the first switching means conducts and dumps a portion of the charge on the storage means into the set coil when the quantum of charge thereon exceeds a predetermined level and the second switching means conducts and dumps the residual charge on said storage means into the reset coil when the level of the enabling electrical signal falls below the residual charge on said storage means.

13. The improved circuit of claim 12 further including a diode and a capacitor connected in series with the reset coil and operable to provide a low resistance electrical discharge path during an interval when current is flowing from the storage means into the reset coil.

14. The improved circuit of claim 12 further including a resistor, a diode connected in series to the resistor; wherein the series resistor-diode is coupled in series with the storage means and operable to limit the rate at which said storage means is being charged.

15. In a communication network system having a communication link wherein bistable relays are being utilized for inserting a plurality of network ports into the link with the relays being responsive to an enabling electrical signal generated from a device connected to said ports an improved circuit arrangement for controlling the bistable relay comprising:
   (1) a pair of input operable coupled to receive the input signal;
   (2) a reference voltage means for defining a reference voltage coupled across the input terminals;
   (3) a first storage means coupled across the input terminals, said first storage means being in parallel with the reference means and the set coil of the relays;

(4) a switching means coupled in series with the set coil and operable to discharge the storage means periodically into the set coil;

(5) a second storage means connected to at least one of the input terminals; and (6) a first comparator means coupled to the switching means; said comparator means being operable to monitor the voltages on the reference voltage means and the second storage means and to initiate a current flow in the switching means when the voltage on the second storage means is greater than the voltage on the reference voltage means whereby the curent flow in the switching means causes the charge on the first storage means to be dumped into the set coil.

16. The improved circuit arrangement of claim 15 further including a second comparator means coupled to the reset coil of the relay, the first storage means and at least one of the input terminals; said comparator means being operable to sense the voltage on the first storage means and the enabling electrical signal and periodically discharging the first storage means into said reset coil.

17. The improved circuit arrangement of claim 15 wherein the switching means includes a transistor switch.

18. The improved circuit arrangement of claim 17 wherein the first comparator means includes a programmable unijunction transistor (PUT) having an anode electrode connected to the second storage means, a gate electrode connected to the reference voltage means and a cathode electrode coupled to the transistor switch.

19. The improved circuit recited in claim 18 further including a resistor interconnecting the cathode to the emitter electrode of the transistor switch.

20. The improved circuit recited in claim 19 further including a diode interconnecting the cathode to the base of the transistor switch.

21. A circuit arrangement for use in a telecommunication system to insert a station into the system comprising:

signal generating means associated with the station and operable to generate an enabling signal indicative of the station's desire for inserting into the system;

at least one storage means operable to receive the signal and develop an electrical charge therefrom;

a bistable relay having a set and a reset coil arranged in parallel with the storage means and operable for energizing the relay between first and second positions;

a first switch means coupling the storage means with the set coil and operable to monitor the charge on the storage means and causing said storage means to discharge into the set coil to set said relay into a first state when the charge exceeds a predetermined value; and a second switch means having a controlling electrode coupled to detect the enabling signal and the charge on the storage means and to discharge the storage means into the reset coil when the level of the enabling signal falls below the charge on the first storage means thereby switching the relay into its second position.

22. A control circuit suitable for driving the set and reset coil of a bistable relay comprising:

a supply voltage source;

at least one storage means coupled to the supply voltage source, said storage means being operable for storing a charge with sufficient magnitude for setting and resetting the bistable relay;

a first switching means coupled to the storage means and the set coil, said first switching means being operable when activated for causing the storage means to discharge a portion of its stored charge into the set coil thereby setting the relay;

a second switching means operable for coupling the storage means to the reset coil; said second switching means being operable for monitoring voltage differences between the supply voltage source and storage means and to cause said storage means to discharge the remaining portion of its charge into the reset coil so that said relay is reset when the voltage differences fall below a predetermined level.

23. The control circuit of claim 22 further including a first circuit means coupling the storage means and the first switching means; said first circuit means being operable for setting a reference voltage level and for energizing said first switching means when the stored charge on the storage means is greater than the reference voltage.

* * * * *